(12) United States Patent
Pei et al.

(10) Patent No.: US 9,064,745 B2
(45) Date of Patent: Jun. 23, 2015

(54) SUBLITHOGRAPHIC WIDTH FINFET EMPLOYING SOLID PHASE EPITAXY

(75) Inventors: Chengwen Pei, Danbury, CT (US); Kangguo Cheng, Schenectady, NY (US); Joseph Ervin, Wappingers Falls, NY (US); Juntao Li, Guilderland, NY (US); Ravi M. Todi, Poughkeepsie, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 279 days.

(21) Appl. No.: 13/597,752

(22) Filed: Aug. 29, 2012

(65) Prior Publication Data

US 2014/0061793 A1  Mar. 6, 2014

(51) Int. Cl.
| | |
|---|---|
| *H01L 21/336* | (2006.01) |
| *H01L 27/12* | (2006.01) |
| *H01L 21/8238* | (2006.01) |
| *H01L 21/84* | (2006.01) |
| *H01L 29/66* | (2006.01) |
| *H01L 27/092* | (2006.01) |

(52) U.S. Cl.
CPC .... *H01L 27/1211* (2013.01); *H01L 21/823821* (2013.01); *H01L 21/845* (2013.01); *H01L 29/66795* (2013.01); *H01L 27/0924* (2013.01)

(58) Field of Classification Search
CPC ...................... H01L 21/0245; H01L 21/02532; H01L 21/3226; H01L 21/2022; H01L 27/1203; H01L 27/1211; H01L 27/12; H01L 29/66795; H01L 29/785

USPC .................. 257/347, 618, E21.409, E27.112, 257/E29.005; 438/197, 311
See application file for complete search history.

(56) References Cited

U.S. PATENT DOCUMENTS

| | | | |
|---|---|---|---|
| 6,403,434 B1 | 6/2002 | Yu | |
| 6,413,802 B1 | 7/2002 | Hu et al. | |
| 6,475,869 B1 | 11/2002 | Yu | |
| 6,489,193 B1 * | 12/2002 | Chen et al. | 438/222 |

(Continued)

OTHER PUBLICATIONS

Pouydebasque, A. et al., "CMOS Integration of Solid Phase Epitaxy for sub-50nm Devices" Proceedings of 35th European Solid-State Device Research Conference (Sep. 12-16, 2005) pp. 419-422.

(Continued)

*Primary Examiner* — Khiem D Nguyen
(74) *Attorney, Agent, or Firm* — Scully, Scott, Murphy & Presser, P.C.; H. Daniel Schnurmann

(57) ABSTRACT

A dielectric mandrel structure is formed on a single crystalline semiconductor layer. An amorphous semiconductor material layer is deposited on the physically exposed surfaces of the single crystalline semiconductor layer and surfaces of the mandrel structure. Optionally, the amorphous semiconductor material layer can be implanted with at least one different semiconductor material. Solid phase epitaxy is performed on the amorphous semiconductor material layer employing the single crystalline semiconductor layer as a seed layer, thereby forming an epitaxial semiconductor material layer with uniform thickness. Remaining portions of the epitaxial semiconductor material layer are single crystalline semiconductor fins and thickness of these fins are sublithographic. After removal of the dielectric mandrel structure, the single crystalline semiconductor fins can be employed to form a semiconductor device.

16 Claims, 15 Drawing Sheets

(56) References Cited

U.S. PATENT DOCUMENTS

| | | |
|---|---|---|
| 6,521,502 B1 | 2/2003 | Yu |
| 6,756,277 B1 | 6/2004 | Yu |
| 7,186,630 B2 | 3/2007 | Todd |
| 7,247,570 B2 | 7/2007 | Thomas |
| 7,285,812 B2 | 10/2007 | Tang et al. |
| 7,368,344 B2 | 5/2008 | Haller |
| 7,371,627 B1 | 5/2008 | Forbes |
| 7,425,491 B2 | 9/2008 | Forbes |
| 7,626,219 B2 | 12/2009 | Forbes |
| 7,626,223 B2 | 12/2009 | Haller |
| 7,687,342 B2 | 3/2010 | Haller et al. |
| 7,696,567 B2 | 4/2010 | Haller et al. |
| 7,745,873 B2 | 6/2010 | Forbes |
| 7,768,051 B2 | 8/2010 | Abbott |
| 7,768,073 B2 | 8/2010 | Wells |
| 7,935,999 B2 | 5/2011 | Haller et al. |
| 7,939,409 B2 | 5/2011 | Figura et al. |
| 7,977,236 B2 | 7/2011 | Nejad et al. |
| 7,983,070 B2 | 7/2011 | Forbes |
| 2007/0231985 A1 | 10/2007 | Forbes |
| 2008/0038889 A1* | 2/2008 | Cho et al. ............. 438/268 |
| 2010/0044758 A1 | 2/2010 | Cohen et al. |
| 2011/0171795 A1 | 7/2011 | Tsai et al. |

OTHER PUBLICATIONS

Lee, K.S. et al., "Low-Temperature Solid Phase Epitaxial Regrowth of Silicon for Stacked Static Random Memory Application" Japanese Journal of Applied Physics (Jan. 2011) pp. 01AB06-1-01AB06-6, vol. 50.

Liu, H. et al., "Characterization of the Ultrathin Vertical Channel CMOS Technology" IEEE Transactions on Electron Devices (Jan. 2004) pp. 106-1112, vol. 51, No. 1.

* cited by examiner

SUBLITHOGRAPHIC WIDTH FINFET EMPLOYING SOLID PHASE EPITAXY

BACKGROUND

The present disclosure generally relates to a semiconductor structure, and particularly to a fin field effect transistor having at least one semiconductor fin having a sublithographic width and formed by solid phase epitaxy, and methods of manufacturing the same.

Fin field effect transistors (finFETs) employ a semiconductor fin having substantially vertical sidewalls. Because channels can be formed underneath the substantially vertical sidewalls of a finFET, a finFET can provide a higher on-current per unit device area compared with conventional planar semiconductor devices.

One of the difficulties of conventional finFETs is that the width of a semiconductor fin is limited by minimum lithographic dimensions that can be printed on a photoresist layer. Further, the aspect ratio of the semiconductor fins is limited due to limited selectivity of the etch process employed to form the semiconductor fins and the need to prevent a pattern collapse in a patterned photoresist layer. The etch process that is employed to transfer the pattern in the photoresist layer into a semiconductor layer to form semiconductor fins also tends to introduce line edge roughness (LER) during the pattern transfer. In many cases, a dielectric fin cap portion, such as a silicon nitride fin cap portion, adds to the parasitic capacitance of the semiconductor fin and degrades fin FET performance. The combination of these factors limits the pattern density in conventional semiconductor devices employing finFETs.

SUMMARY

A dielectric mandrel structure is formed on a single crystalline semiconductor layer. An amorphous semiconductor material layer is deposited on the physically exposed surfaces of the single crystalline semiconductor layer and surfaces of the mandrel structure. Optionally, the amorphous semiconductor material layer can be implanted with at least one different semiconductor material. Solid phase epitaxy is performed on the amorphous semiconductor material layer employing the single crystalline semiconductor layer as a seed layer, thereby forming an epitaxial semiconductor material layer. Remaining portions of the epitaxial semiconductor material layer are single crystalline semiconductor fins. After removal of the dielectric mandrel structure, the single crystalline semiconductor fins can be employed to form a semiconductor device.

According to an aspect of the present disclosure, a method of forming a semiconductor structure is provided. A dielectric mandrel structure having vertical sidewalls is formed on a single crystalline semiconductor material layer. An amorphous semiconductor material layer is formed on the vertical sidewalls and a top surface of the single crystalline semiconductor material layer. The amorphous semiconductor material layer is converted into an epitaxial semiconductor material layer employing a crystalline structure of the single crystalline semiconductor material layer as a template. An epitaxial semiconductor fin is formed from the epitaxial semiconductor material layer by removing horizontal portions of the epitaxial semiconductor material layer.

According to another aspect of the present disclosure, a semiconductor structure is provided. The semiconductor structure includes a dielectric mandrel structure having vertical sidewalls and located on a single crystalline semiconductor material layer. The semiconductor structure further includes at least one vertical epitaxial semiconductor material portion in epitaxial alignment with a crystalline structure of the single crystalline semiconductor material layer, in contact with at least one of the vertical sidewalls, vertically extending from a top surface of the single crystalline semiconductor material layer to a top surface of the dielectric mandrel structure, and having a uniform lateral thickness throughout an entirety thereof.

According to yet another aspect of the present disclosure, another semiconductor structure including at least a field effect transistor is provided. The field effect transistor includes a portion of a single crystalline semiconductor material layer, a plurality of epitaxial semiconductor fins in epitaxial alignment with a crystalline structure of the portion of the single crystalline semiconductor material layer and having a uniform lateral thickness throughout, a stack of a gate dielectric and a gate electrode straddling over a center portion of each of the plurality of epitaxial semiconductor fins, a plurality of fin source regions located within a first end portion of each of the plurality of epitaxial semiconductor fins, and a plurality of fin drain regions located within a second end portion of each of the plurality of epitaxial semiconductor fins. The field effect transistor further includes a planar source region located in a first surface portion of the single crystalline semiconductor material layer and in contact with each of the plurality of source regions, and a planar drain region located in a second surface region of the single crystalline semiconductor material layer and in contact with each of the plurality of drain regions.

DETAILED DESCRIPTION

Figure 1A:
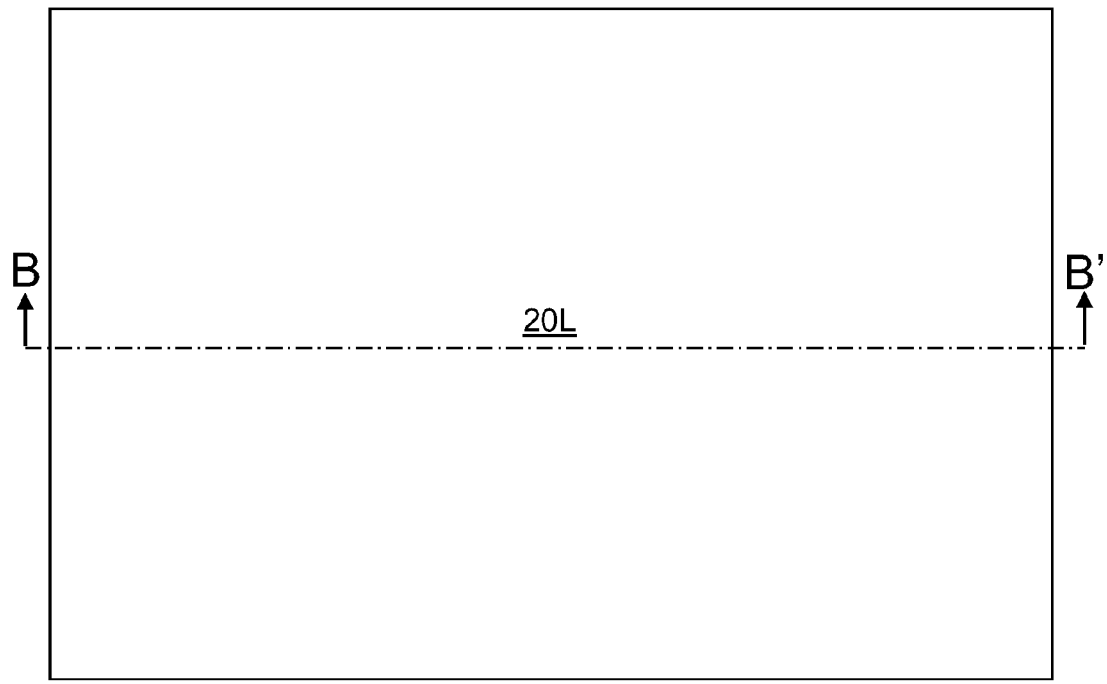
FIG. 1A is a top-down view of a first exemplary semiconductor structure after formation of a shallow trench isolation structure and a dielectric material layer according to a first embodiment of the present disclosure.

As stated above, the present disclosure relates to a semiconductor structure, and particularly to a fin field effect transistor having at least one semiconductor fin having a sublithographic width and formed by solid phase epitaxy, and methods of manufacturing the same, which are now described in detail with accompanying figures. Like and corresponding elements mentioned herein and illustrated in the drawings are referred to by like reference numerals. The drawings are not necessarily drawn to scale.

Figure 1B:
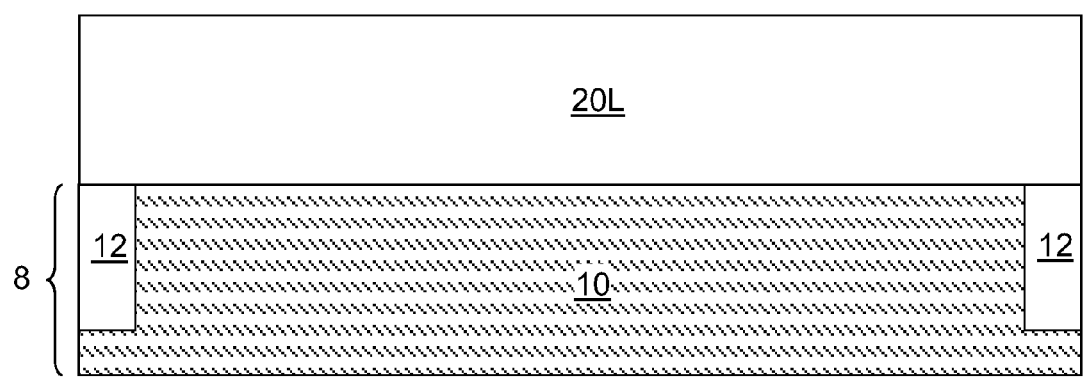
FIG. 1B is a vertical cross-sectional view of the first exemplary semiconductor structure along a vertical plane B-B' of FIG. 1A.

Referring to FIGS. 1A and 1B, a first exemplary semiconductor according to a first embodiment of the present disclosure includes a substrate 8 including a single crystalline semiconductor material layer 10, a shallow trench isolation structure 12 embedded in an upper portion of the single crystalline semiconductor material layer 10, and a dielectric material layer 20L formed on a top surface of the substrate 8.

The single crystalline semiconductor material layer 10 includes a first semiconductor material having a first lattice constant. The first semiconductor material may be selected from, but is not limited to, silicon, germanium, silicon-germanium alloy, silicon carbon alloy, silicon-germanium alloy-carbon alloy, gallium arsenide, indium arsenide, indium phosphide, III-V compound semiconductor materials, II-VI compound semiconductor materials, organic semiconductor materials, and other compound semiconductor materials. In one embodiment, the substrate 8 can be a bulk semiconductor substrate, and the entirety of the substrate 8 other than the shallow trench isolation structure 12 can be the single crystalline semiconductor material layer 10. In another embodiment, the substrate 8 can be a semiconductor-on-insulator substrate that includes a buried insulator layer (not shown) that contacts a bottom surface of the shallow trench isolation structure, and a handle substrate (not shown) located underneath the buried insulator layer. The entirety of the single crystalline semiconductor material layer 10 can be single crystalline.

The dielectric material layer 20L includes a dielectric material such as silicon oxide, silicon nitride, silicon oxynitride, an organosilicate glass (OSG), a dielectric metal oxide, or combinations thereof. The dielectric material layer 20L can be deposited as a blanket layer (unpatterned layer), for example, by chemical vapor deposition (CVD). The thickness of the dielectric material layer 20L can be from 10 nm to 300 nm, although lesser and greater thicknesses can also be employed.

Figure 2A:
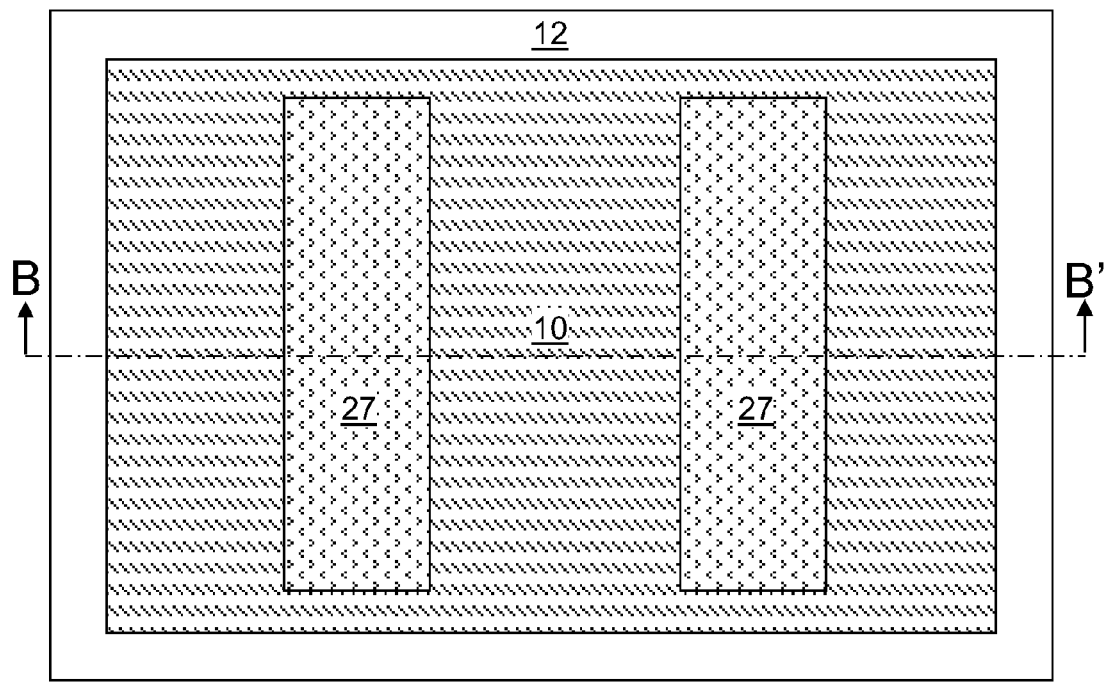
FIG. 2A is a top-down view of the first exemplary semiconductor structure after patterning of the dielectric material layer to form dielectric mandrel structures according to the first embodiment of the present disclosure.
Figure 2B:
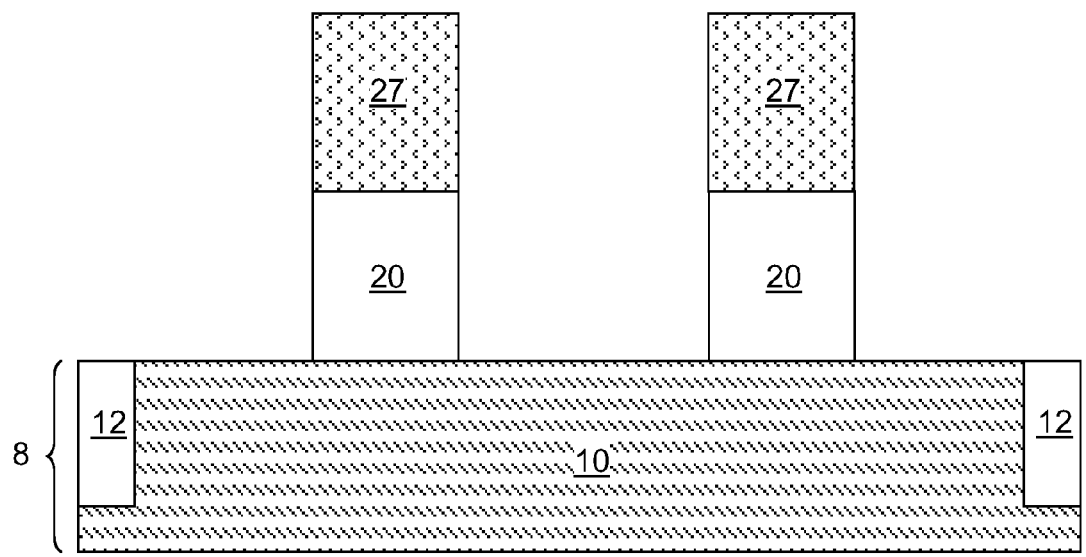
FIG. 2B is a vertical cross-sectional view of the first exemplary semiconductor structure along a vertical plane B-B' of FIG. 2A.

Referring to FIGS. 2A and 2B, a photoresist layer 27 is applied over the top surface of the dielectric material layer 20L, and is lithographically patterned to cover at least one portion of the dielectric material layer 20L. In one embodiment, the shape of an area covered by a lithographically patterned portion of the photoresist layer 27 can be a rectangle. In one embodiment, the width the rectangle can be a lithographic minimum dimension, i.e., the minimum dimension that can be printed by a single lithographic exposure and development.

The pattern in the photoresist layer 27 can be transferred into the dielectric material layer 20L by an anisotropic etch, which can be, for example, a reactive ion etch. In one embodiment, the anisotropic etch can be selective to the first semiconductor material of the single crystalline semiconductor material layer 10.

Remaining portions of the dielectric material layer 20L located underneath the photoresist layer 27 are herein referred to as dielectric mandrel structures 20. In other words, each patterned portion of the dielectric material layer 20L constitutes a dielectric mandrel structure 20. Each dielectric mandrel structure 20 includes vertical sidewalls. In one embodiment, at least one of the dielectric mandrel structures 20 has a horizontal cross-sectional shape of a rectangle, and correspondingly, has two pairs of parallel vertical sidewalls. The photoresist layer 27 is removed, for example, by ashing.

Figure 3A:
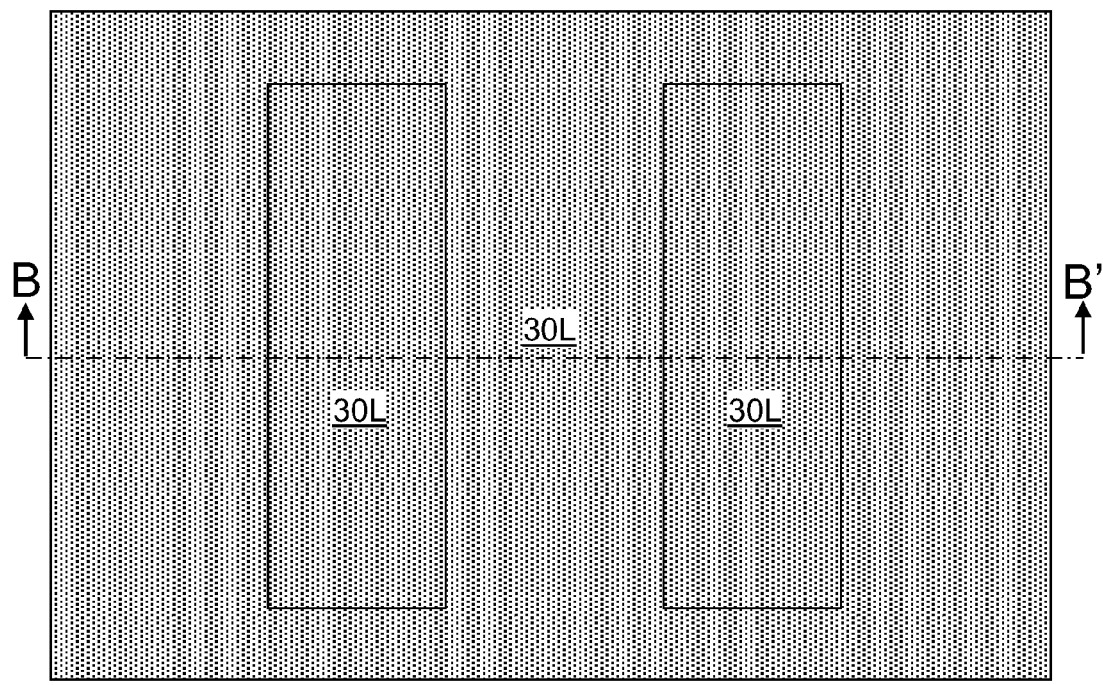
FIG. 3A is a top-down view of the first exemplary semiconductor structure after formation of an amorphous semiconductor material layer according to the first embodiment of the present disclosure.

Referring to FIG. 3A, an amorphous semiconductor material layer 30L is deposited on physically exposed surfaces of the substrate 8 and the dielectric mandrel structures 20. The amorphous semiconductor material layer 30L includes a second semiconductor material, which can have the same composition as the first semiconductor material, or can have a composition different from the composition of the first semiconductor material. The amorphous semiconductor material layer 30L is deposited on the vertical sidewalls of the dielectric mandrel structures 20 and the top surface of the single crystalline semiconductor material layer 10.

In one embodiment, the second semiconductor material of the amorphous semiconductor material layer 30L can be a material that has the same lattice constant in a crystalline state as the lattice constant of the single crystalline semiconductor material layer 10. In one embodiment, the second semiconductor material can have the same composition as the first semiconductor material, and differ from the first semiconductor material of the single crystalline semiconductor material layer 10 only by amorphousness of the material, i.e., the lack of crystallinity of the material.

In one embodiment, the second semiconductor material of the amorphous semiconductor material layer 30L can be a material that has a lattice constant in a crystalline state that is different from the lattice constant of the single crystalline semiconductor material layer 10. In one embodiment, a single crystalline semiconductor material having the same composition as the second semiconductor material can have a lattice constant that is different from the first lattice constant by a percentage greater than 0 and less than 3% in an unstrained state.

The amorphous semiconductor material layer 30L can be deposited by chemical vapor deposition (CVD) or atomic layer deposition (ALD). The thickness of the amorphous semiconductor material layer 30L can be uniform throughout the entirety thereof, and can be from 2 nm to 30 nm, although lesser and greater thicknesses can also be employed.

Figure 4A:
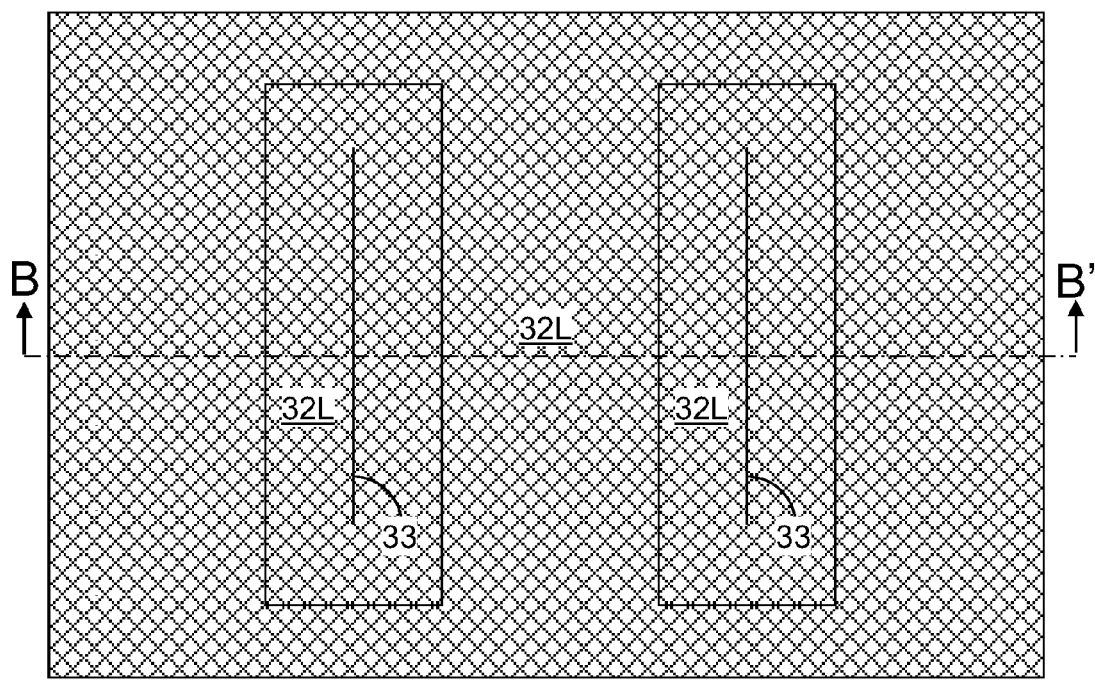
FIG. 4A is a top-down view of the first exemplary semiconductor structure after conversion of the amorphous semiconductor material layer into an epitaxial semiconductor material layer according to the first embodiment of the present disclosure.
Figure 4B:
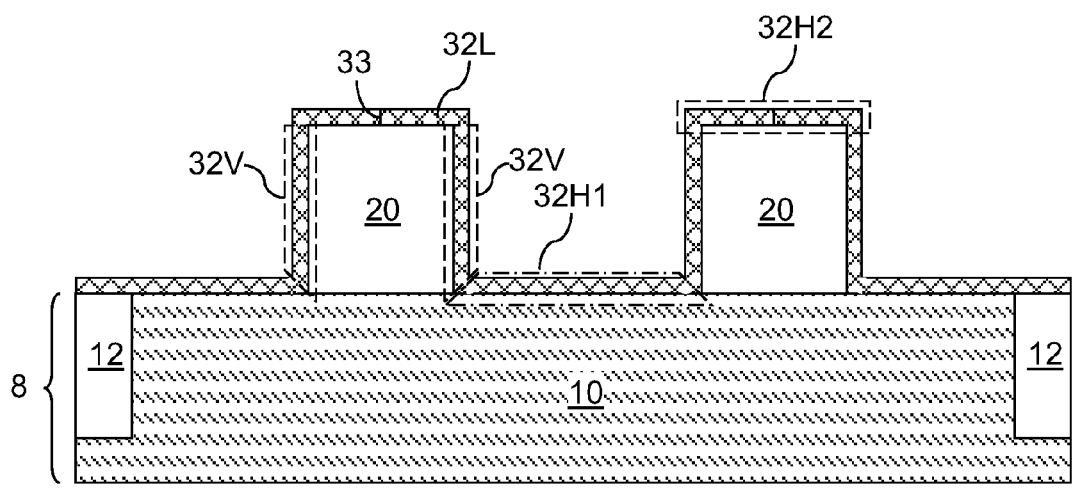
FIG. 4B is a vertical cross-sectional view of the first exemplary semiconductor structure along a vertical plane B-B' of FIG. 4A.

Referring to FIGS. 4A and 4B, the amorphous semiconductor material layer 30L is converted into an epitaxial semiconductor material layer 32L employing the crystalline structure of the single crystalline semiconductor material layer 10 as a template. In one embodiment, the conversion of the amorphous semiconductor material layer 30L into the epitaxial semiconductor material layer 32L can be performed by solid phase epitaxy. During the solid phase epitaxy, crystalline portions of the epitaxial semiconductor material layer 32L nucleate at an interface between the single crystalline semiconductor material layer 10 and the amorphous semiconductor material layer 30L. The crystalline portions of the epitaxial semiconductor material layer 32L grow upward by incorporating the second semiconductor material of the amorphous semiconductor material layer 30L, and by converting the amorphous material of the amorphous semiconductor material layer 30L into a crystalline second semiconductor material in epitaxial alignment with the crystalline structure of the single crystalline semiconductor material layer 10. The lattice constant of the crystalline second semiconductor material of the epitaxial semiconductor material layer 32L is herein referred to as a second lattice constant.

In one embodiment, the first lattice constant and the second lattice constant can be the same. In this case, the first semiconductor material of the single crystalline semiconductor material layer 10 and the crystalline second semiconductor material in the epitaxial semiconductor material layer 32L can have the same lattice constant, and the crystalline second semiconductor material is not strained.

In another embodiment, the second lattice constant can be different from the first lattice constant. In this case, the second lattice constant that is different from the first lattice constant by a percentage greater than 0 and less than 3%. The actual lattice constant along horizontal directions of portions of the crystalline second semiconductor material of the epitaxial semiconductor material layer 32L in proximity to the single crystalline semiconductor material layer 10 can be the same as the first lattice constant through deformation of lattice structures in such portions. The vertical lattice constant of such portions of the crystalline second semiconductor material of the epitaxial semiconductor material layer 32L in proximity to the single crystalline semiconductor material layer 10 can be different from the first lattice constant in order to compensate for the deformation of the lattice structure of the crystalline second semiconductor material along horizontal directions.

The first exemplary semiconductor structure of FIGS. 4A and 4B includes a dielectric mandrel structure 20 having vertical sidewalls and located on a single crystalline semiconductor material layer 10 of a substrate 8, at least one vertical epitaxial semiconductor material portion 32V (which is a vertical portion of the epitaxial semiconductor material layer 32L above the top surface of the substrate 8 and below the top surface of the dielectric mandrel structures 20) in epitaxial alignment with a crystalline structure of the single crystalline semiconductor material layer 10, in contact with at least one of the vertical sidewalls of the dielectric mandrel structure 20, vertically extending from a top surface of the single crystalline semiconductor material layer 10 to a top surface of the dielectric mandrel structure 20, and having a uniform lateral thickness.

Further, the first exemplary semiconductor structure of FIGS. 4A and 4B includes a first horizontal epitaxial semiconductor material portion 32H1 in epitaxial alignment with the crystalline structure of the single crystalline semiconductor material layer 10, in contact with a top surface of the single crystalline semiconductor material layer 10, and having a uniform vertical thickness, wherein the uniform vertical thickness is the same as the uniform lateral thickness, and a second horizontal epitaxial semiconductor material portion 32H2 in epitaxial alignment with the crystalline structure of the single crystalline semiconductor material layer 10, in contact with a top surface of the dielectric mandrel structure 20, and having the uniform vertical thickness.

If the vertical sidewalls of a dielectric mandrel structure is linear, i.e., within a two-dimensional vertical plane, a linear grain boundary 33 can be embedded within the second horizontal epitaxial semiconductor material portion 32H2. Each linear grain boundary 33 is a grain boundary in a linear shape at which two crystalline domains contact without epitaxial alignment therebetween. The cause of formation of the grain boundary is accumulation of atomic level alignment errors at the end of solid phase epitaxy at the center of the topmost portions of the amorphous semiconductor material layer 30, which is the region at which that last remaining portions of the amorphous second semiconductor material is converted into crystalline second semiconductor material during the solid phase epitaxy. Each of the at least one vertical epitaxial semiconductor material portion 32V can be a single contiguous vertical epitaxial semiconductor material portion that laterally surrounds the dielectric mandrel structure 20.

Figure 5A:
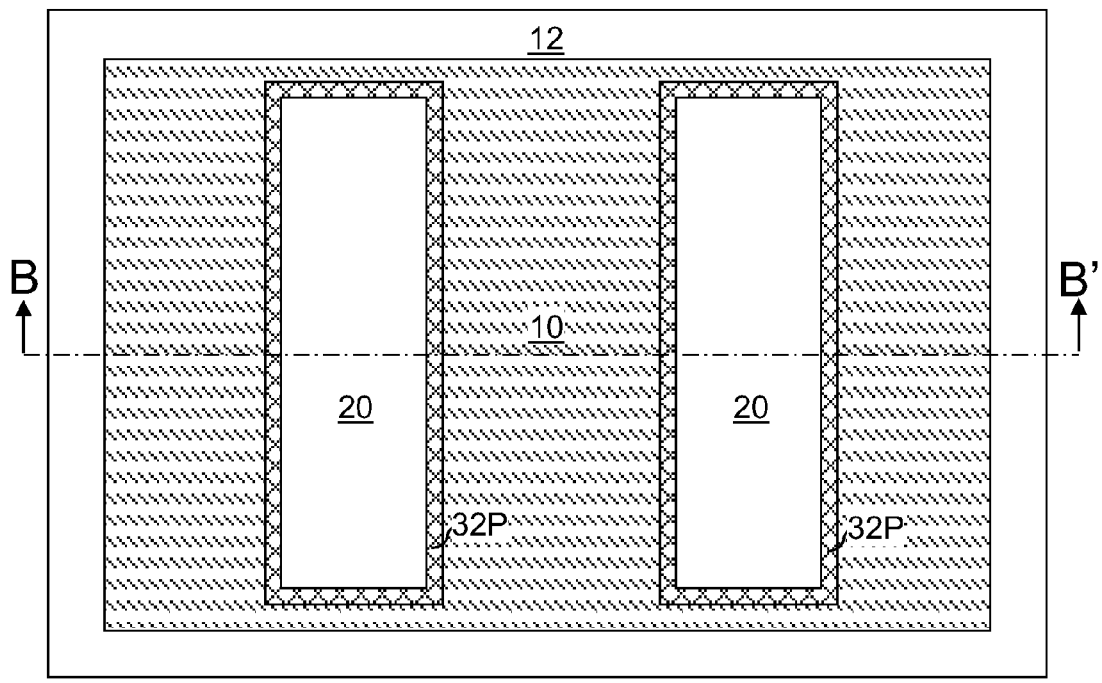
FIG. 5A is a top-down view of the first exemplary semiconductor structure after formation of epitaxial semiconductor fins according to the first embodiment of the present disclosure.
Figure 5B:
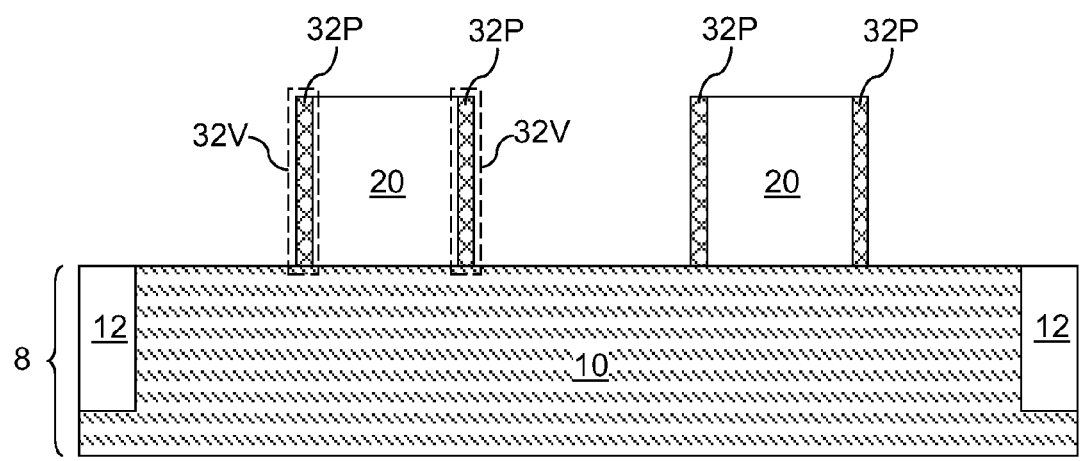
FIG. 5B is a vertical cross-sectional view of the first exemplary semiconductor structure along a vertical plane B-B' of FIG. 5A.

Referring to FIGS. 5A and 5B, an anisotropic etch is performed to remove horizontal portions of the epitaxial semiconductor material layer 32L. The anisotropic etch can be, for example, a reactive ion etch. Each remaining vertical portions of the epitaxial semiconductor material layer 32L constitutes an epitaxial semiconductor fin 32P, which is in epitaxial alignment with the crystalline first semiconductor material of the single crystalline semiconductor material layer 10. Thus, each epitaxial semiconductor fin 32P is formed from the epitaxial semiconductor material layer 32L by removing horizontal portions of the epitaxial semiconductor material layer 32L. Each epitaxial semiconductor fin 32P can be formed as a contiguous structure laterally surrounding a dielectric mandrel structure 20. Because only top portion of horizontal epitaxial layer contains grain boundaries which are removed by RIE, the remaining vertical portions of the epitaxial semiconductor material layer 32L, i.e., the epitaxial semiconductor fins 32P are dislocation free.

The first exemplary semiconductor structure of FIGS. 5A and 5B includes a dielectric mandrel structure 20 having vertical sidewalls and located on a single crystalline semiconductor material layer 10 in a substrate 8, at least one vertical epitaxial semiconductor material portion 32V (which is an epitaxial semiconductor fin 32P) in epitaxial alignment with a crystalline structure of the single crystalline semiconductor material layer 10, in contact with at least one of the vertical sidewalls of the dielectric mandrel structure 20, vertically extending from a top surface of the single crystalline semiconductor material layer 10 to a top surface of the dielectric mandrel structure 20, and having a uniform lateral thickness. Each of the at least one vertical epitaxial semiconductor material portion (i.e., the epitaxial semiconductor fins 32P) can be a single contiguous vertical epitaxial semiconductor material portion that laterally surrounds a dielectric mandrel structure 20.

Figure 6A:
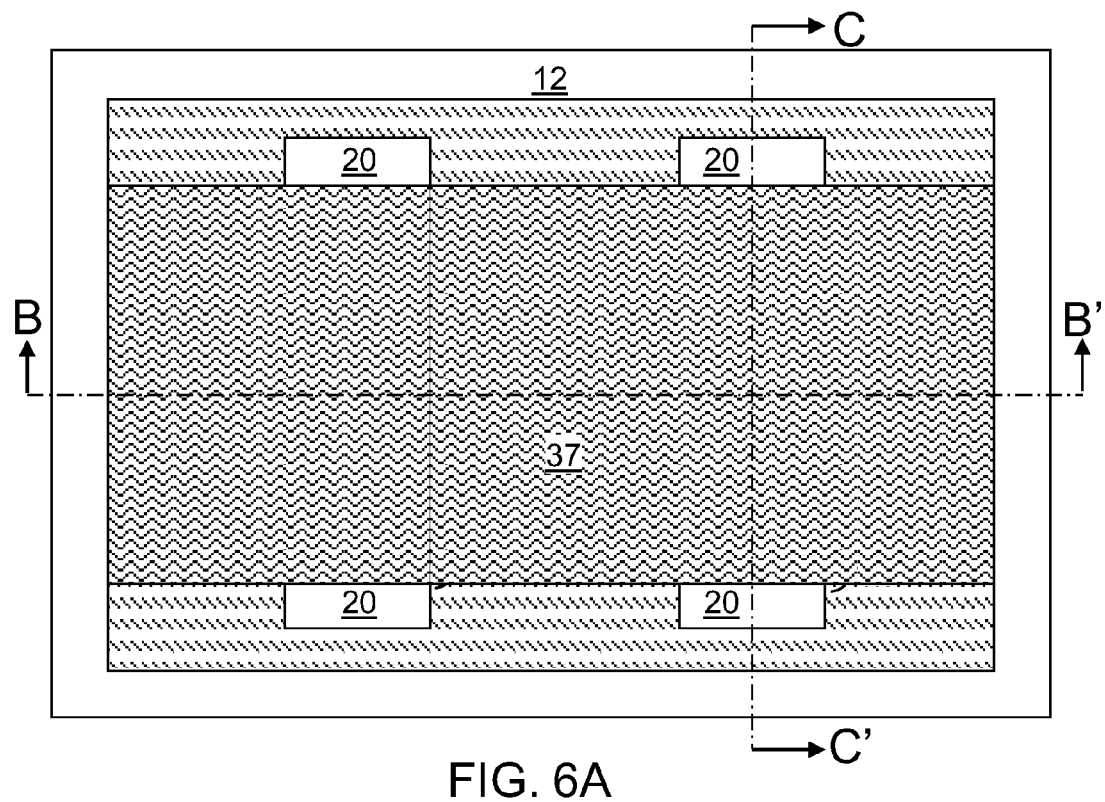
FIG. 6A is a top-down view of the first exemplary semiconductor structure after removal of end portions of the epitaxial semiconductor fins according to the first embodiment of the present disclosure.
Figure 6B:
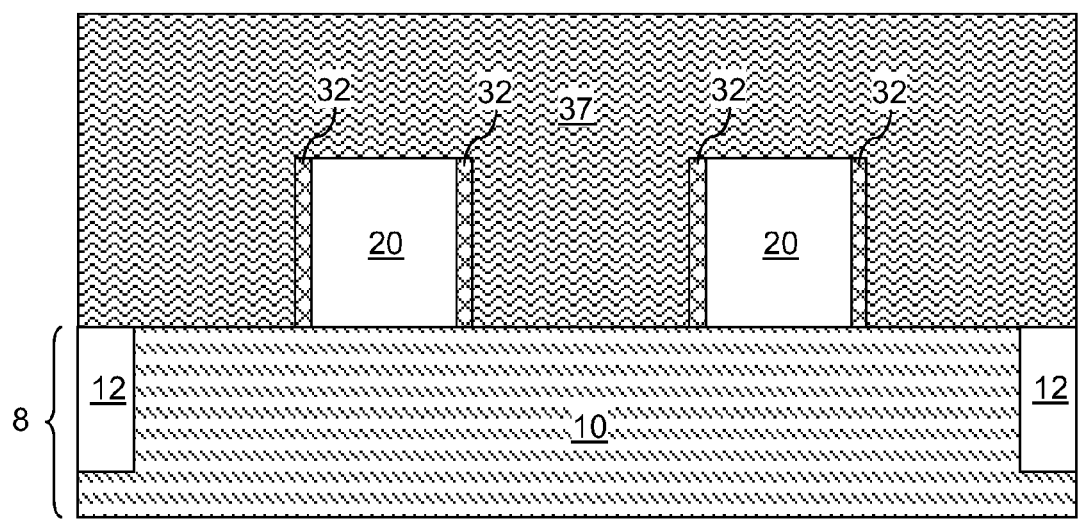
FIG. 6B is a vertical cross-sectional view of the first exemplary semiconductor structure along a vertical plane B-B' of FIG. 6A.
Figure 6C:
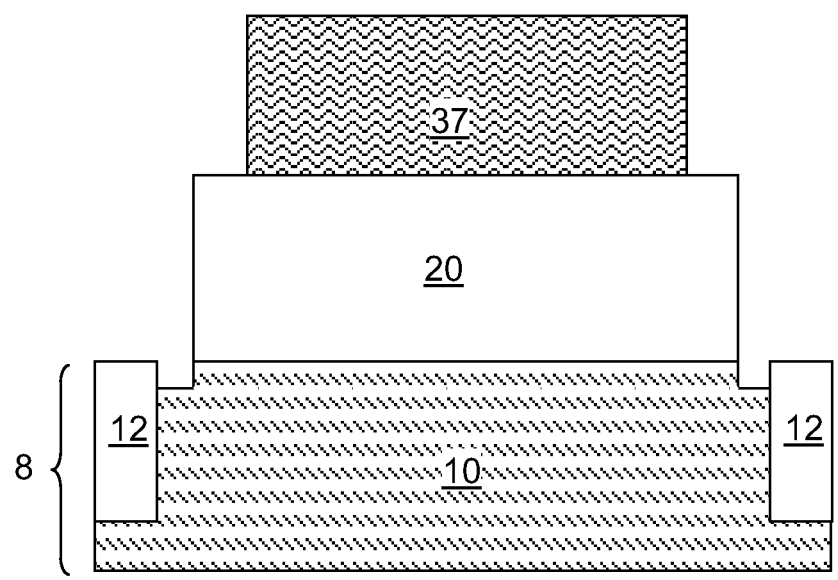
FIG. 6C is a vertical cross-sectional view of the first exemplary semiconductor structure along a vertical plane C-C' of FIG. 6A.

Referring to FIGS. 6A, 6B, and 6C, end portions of the epitaxial semiconductor fins 32P can be removed, for example, by applying a photoresist layer 37, by lithographically patterning the photoresist layer 37 to cover center portions of each epitaxial semiconductor fins 32P while physically exposing end portions of each semiconductor fin 32P located at each end of the lengthwise direction of the epitaxial semiconductor fins 32P, and by etching physically exposed portions of the epitaxial semiconductor fins 32P. The etching of the physically exposed portions of the epitaxial semiconductor fins 32P can be performed, for example, by a wet etch. In one embodiment, physically exposed surfaces of the single crystalline semiconductor material layer 10 can be recessed relative to the interface between the dielectric mandrel structures 20 and the single crystalline semiconductor material layer 10.

Once the end portions of the epitaxial semiconductor fins 32P are removed, remaining portions of each epitaxial semiconductor fin 32P constitute a pair of parallel rectangular epitaxial semiconductor fins 32. Each of the parallel rectangular epitaxial semiconductor fins 32 is an epitaxial semiconductor fin having a rectangular horizontal cross-sectional area. Within each pair of parallel rectangular epitaxial semiconductor fins 32, vertical sidewalls of an epitaxial semiconductor fin 32 are parallel to vertical sidewalls of another semiconductor fin, and are parallel to the lengthwise direction of the dielectric mandrel structure 20 that the pair of epitaxial semiconductor fins 32 is in contact with.

The first exemplary semiconductor structure of FIGS. 6A, 6B, and 6C includes a dielectric mandrel structure 20 having vertical sidewalls and located on a single crystalline semiconductor material layer 10 of a substrate 8, at least one vertical epitaxial semiconductor material portion (which is the pair of epitaxial semiconductor fins 32) in epitaxial alignment with a crystalline structure of the single crystalline semiconductor material layer 10, in contact with at least one of the vertical sidewalls of the dielectric mandrel structure 20, vertically extending from a top surface of the single crystalline semiconductor material layer 10 to a top surface of the dielectric mandrel structure 20, and having a uniform lateral thickness. Each of the at least one vertical epitaxial semiconductor material portion is a pair of parallel rectangular epitaxial semiconductor fins 32, each having a rectangular horizontal cross-sectional area.

The photoresist layer 37 can be subsequently removed, for example, by ashing. Upon removal of the photoresist layer 37, two of the vertical sidewalls of each pair of parallel rectangular epitaxial semiconductor fins 32 become physically exposed.

Figure 7A:
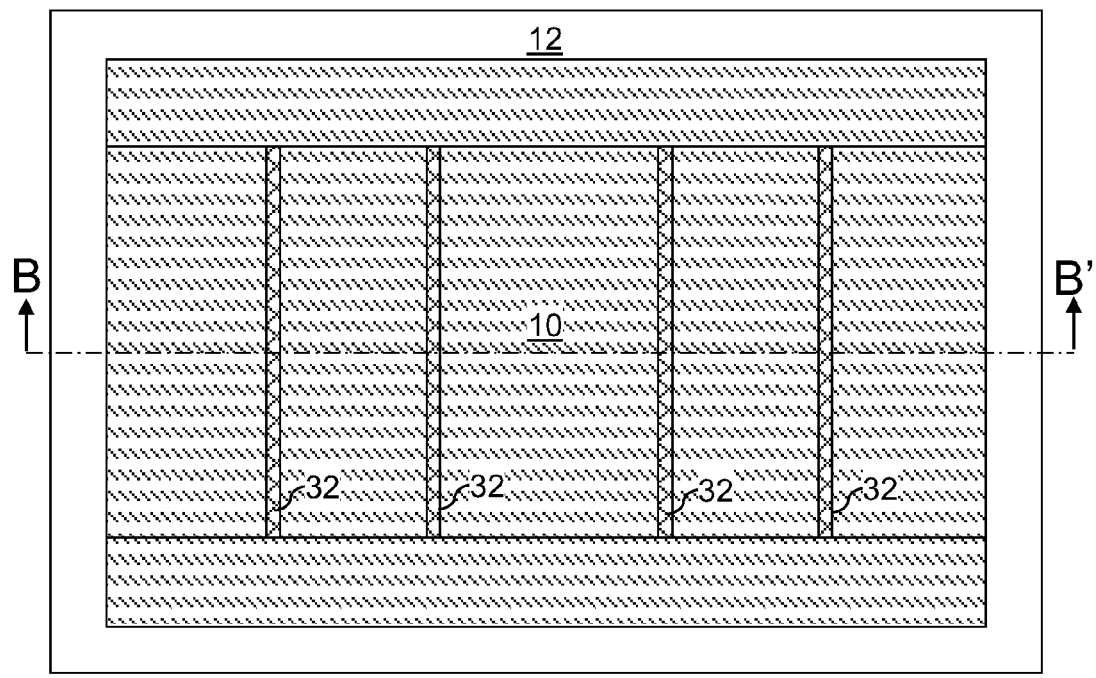
FIG. 7A is a top-down view of the first exemplary semiconductor structure after removal of the dielectric mandrel structures according to the first embodiment of the present disclosure.
Figure 7B:
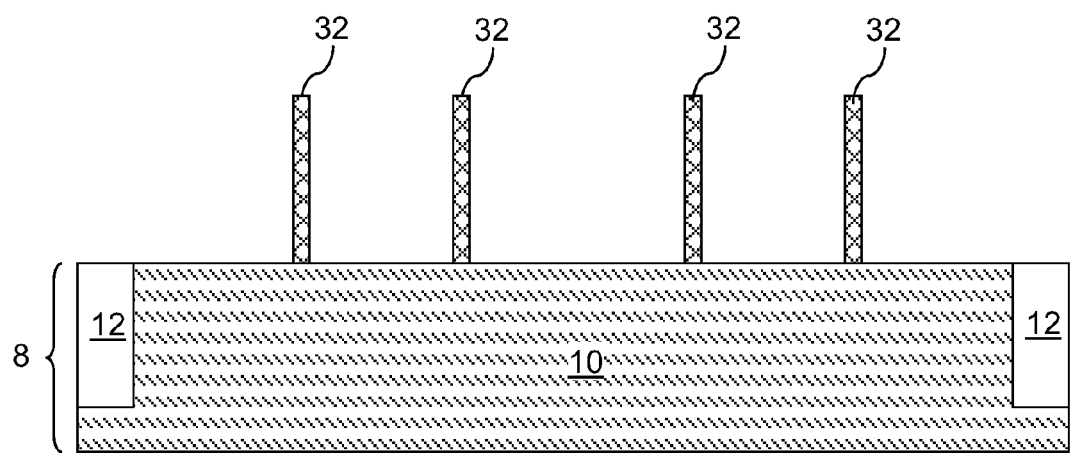
FIG. 7B is a vertical cross-sectional view of the first exemplary semiconductor structure along a vertical plane B-B' of FIG. 7A.

Referring to FIGS. 7A and 7B, the dielectric mandrel structures 20 are removed selective to the semiconductor materials of the epitaxial semiconductor fins 32 and the single crystalline semiconductor material layer 10. The removal of the dielectric mandrel structures 20 can be effected, for example, by a wet etch. For example, if the dielectric mandrel structures 20 includes silicon nitride, a wet etch employing hot phosphoric acid can be employed. If the dielectric mandrel structures 20 include silicon oxide, a wet etch employing hydrofluoric acid can be employed. Optionally, the shallow trench isolation structure 12 can be masked, for example, within a photoresist material (not shown) to prevent collateral etching of the shallow trench isolation structure 12 during the removal of the dielectric mandrel structures 20.

Figure 8A:
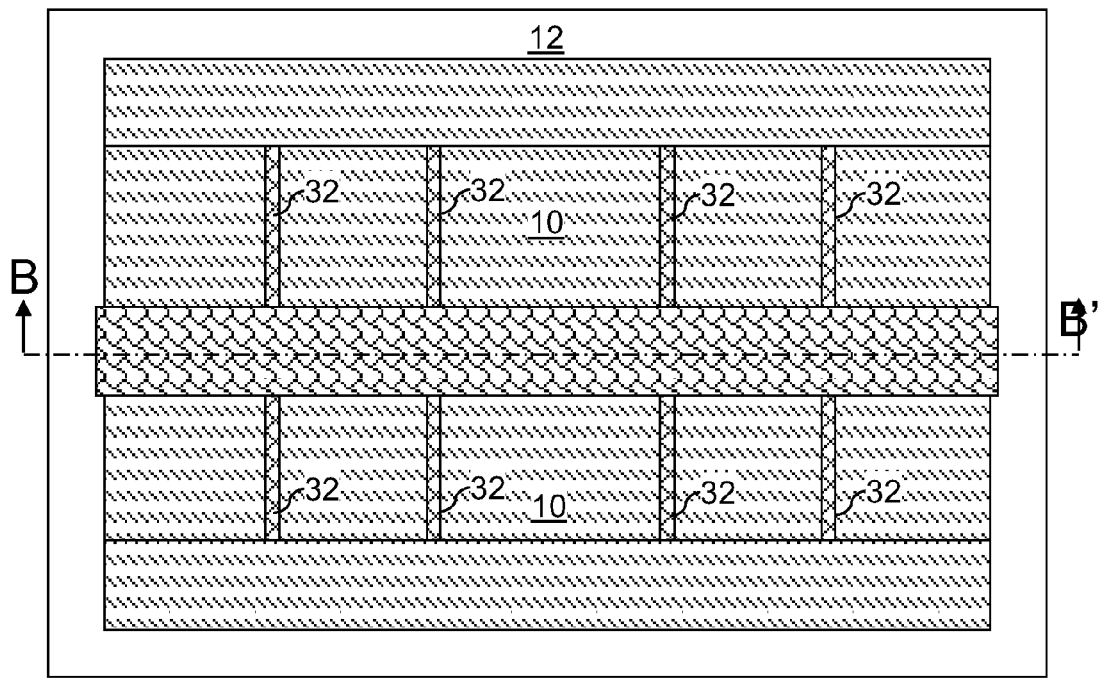
FIG. 8A is a top-down view of the first exemplary semiconductor structure after formation of a gate dielectric and a gate electrode according to the first embodiment of the present disclosure.
Figure 8B:
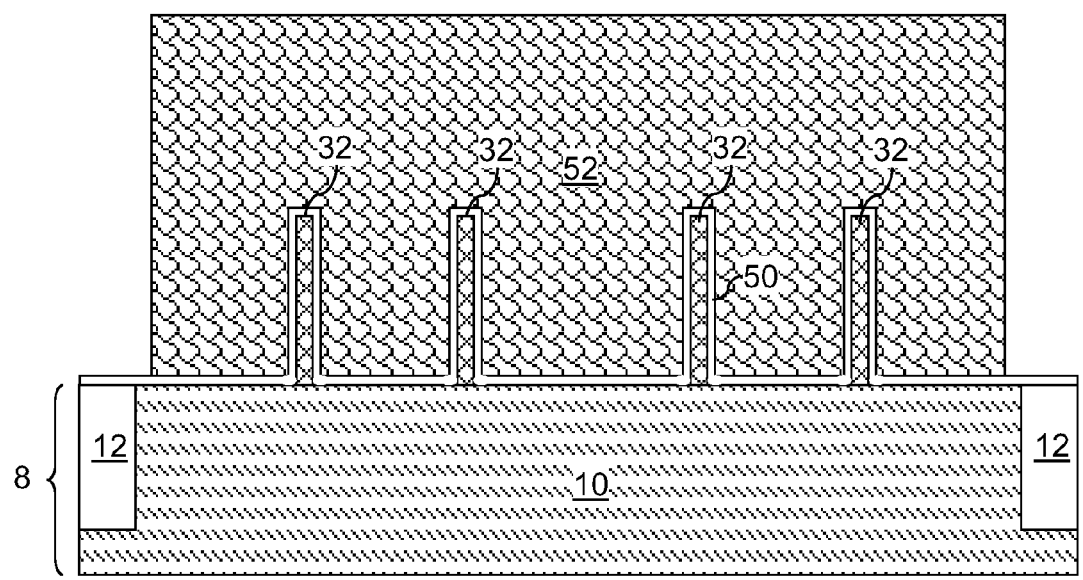
FIG. 8B is a vertical cross-sectional view of the first exemplary semiconductor structure along a vertical plane B-B' of FIG. 8A.

Referring to FIGS. 8A and 8B, a stack of a gate dielectric 50 and a gate electrode 52 is formed on a center portion of the epitaxial semiconductor fins 32. For example, a gate dielectric layer including at least one dielectric material and a gate electrode layer including at least one conductive material can be deposited and lithographically patterned to form the stack of the gate dielectric 50 and the gate electrode 52. The gate dielectric 50 can include any gate dielectric material known in the art. The gate electrode 52 can include any gate electrode material known in the art.

Figure 9A:
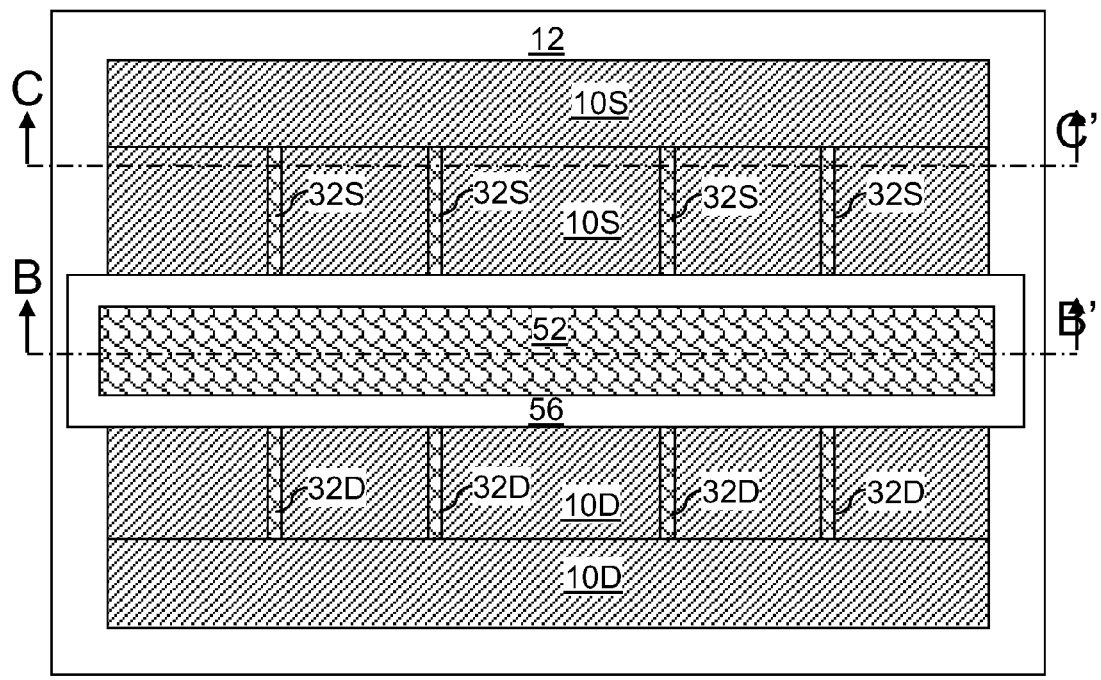
FIG. 9A is a top-down view of the first exemplary semiconductor structure after formation of a gate spacer, source regions, and drain regions according to the first embodiment of the present disclosure.
Figure 9B:
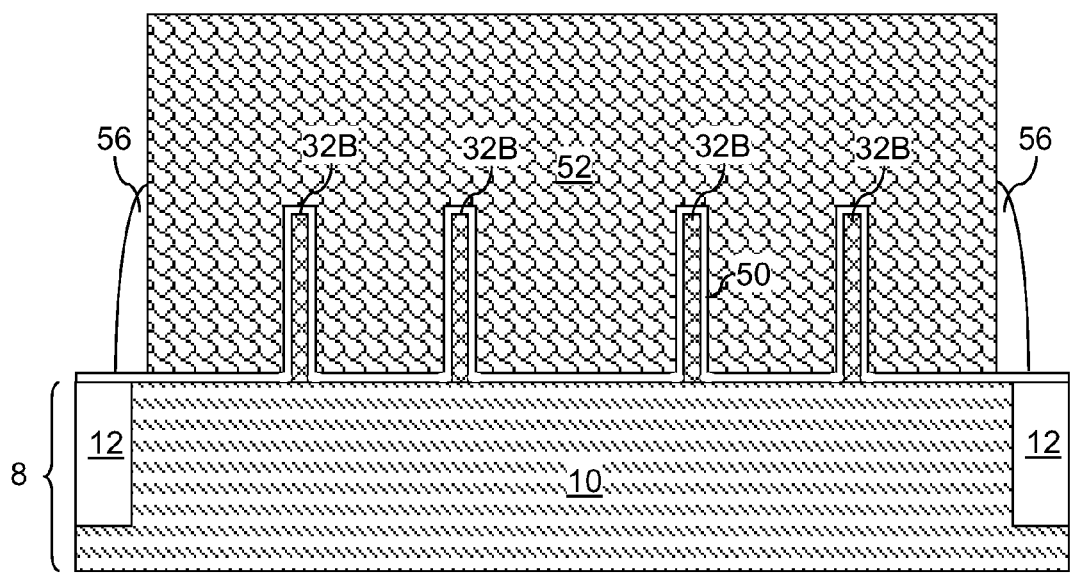
FIG. 9B is a vertical cross-sectional view of the first exemplary semiconductor structure along a vertical plane B-B' of FIG. 9A.
Figure 9C:
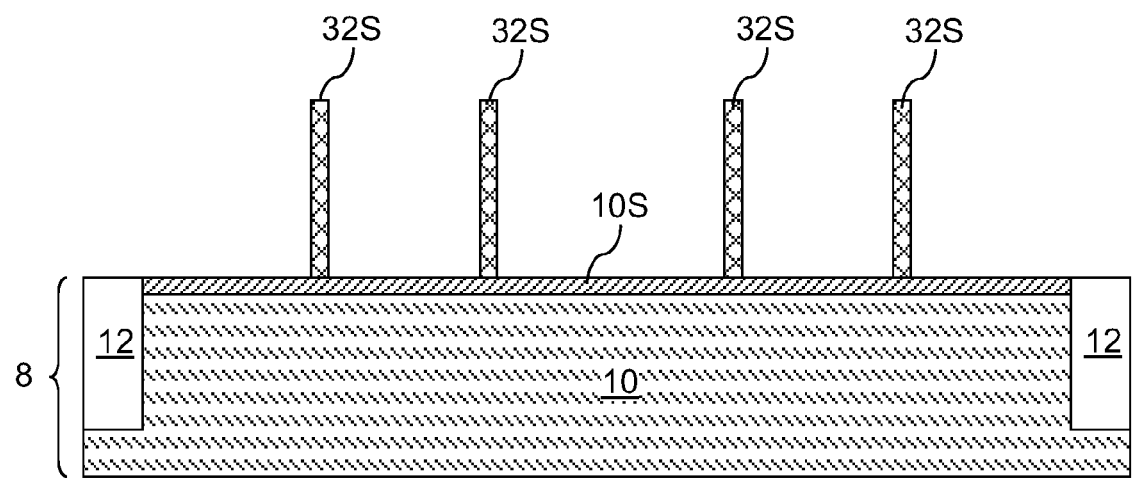
FIG. 9C is a vertical cross-sectional view of the first exemplary semiconductor structure along a vertical plane C-C' of FIG. 9A.

Referring to FIGS. 9A, 9B, and 9C, source and drain extension regions can be formed in the epitaxial semiconductor fins 32 and physically exposed portions of the single crystalline semiconductor material layer 10. A gate spacer 56 including a dielectric material can be formed, for example, by deposition of a conformal dielectric material layer and subsequent removal of horizontal portions of the conformal dielectric material layer. The remaining vertical portions of the conformal dielectric material layer constitute the gate spacer 56.

Source and drain regions can be formed, for example, by ion implantation or plasma doping of dopants. For example, a fin source region 32S can be formed in a first end portion of each epitaxial semiconductor fin 32, and a fin drain region 32D can be formed in a second end portion of each epitaxial semiconductor fin 32 (See FIGS. 8A and 8B). Each first end portion is located at one side of the center portion of an epitaxial semiconductor fin 32, and each second end portion is located at another side of the center portion of the epitaxial semiconductor fin 32. Each epitaxial semiconductor fin 32 can include a fin body region 32B that underlies the stack of the gate dielectric 50 and the gate electrode 52.

Further, a planar source region 10S contacting the fin source regions 32S can be formed within a first surface region of the single crystalline semiconductor material layer 10, and a planar drain region 32D contacting the fin drain regions 32D can be formed within a second surface region of the single crystalline semiconductor material layer 10.

The first exemplary semiconductor structure of FIGS. 9A, 9B, and 9C includes a field effect transistor. The field effect transistor includes a portion of the single crystalline semiconductor material layer 10, a plurality of epitaxial semiconductor fins 32 in epitaxial alignment with a crystalline structure of the portion of the single crystalline semiconductor material layer 10 and having a uniform lateral thickness throughout, a stack of a gate dielectric 50 and a gate electrode 52 straddling over a center portion of each of the plurality of epitaxial semiconductor fins (32S, 32D, 32B), a plurality of fin source regions 32S located within a first end portion of each of the plurality of epitaxial semiconductor fins (32S, 32D, 32B), a plurality of fin drain regions 32S located within a second end portion of each of the plurality of epitaxial semiconductor fins (32S, 32D, 32B). Further, the field effect transistor includes a planar source region 10S located in a first surface portion of the single crystalline semiconductor material layer 10 and in contact with each of the plurality of fin source regions 32S, and a planar drain region 10D located in a second surface region of the single crystalline semiconductor material layer 10 and in contact with each of the plurality of fin drain regions 32D.

In one embodiment, the single crystalline semiconductor material layer 10 can include the first semiconductor material, and the plurality of epitaxial semiconductor fins (32S, 32D, 32B) can include the second semiconductor material, which can have the same lattice constant as, or a different lattice constant than, the first semiconductor material as measured in a natural (unstrained) state.

Figure 10A:
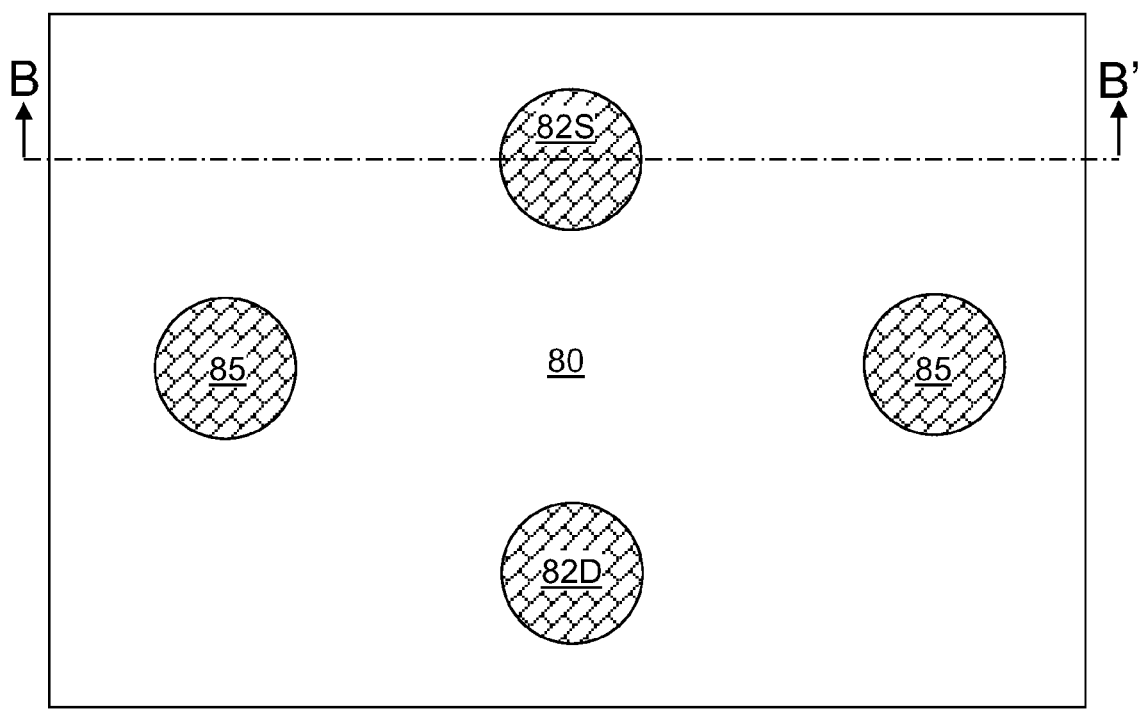
FIG. 10A is a top-down view of the first exemplary semiconductor structure after formation of a contact-level dielectric layer and various contact via structures according to the first embodiment of the present disclosure.
Figure 10B:
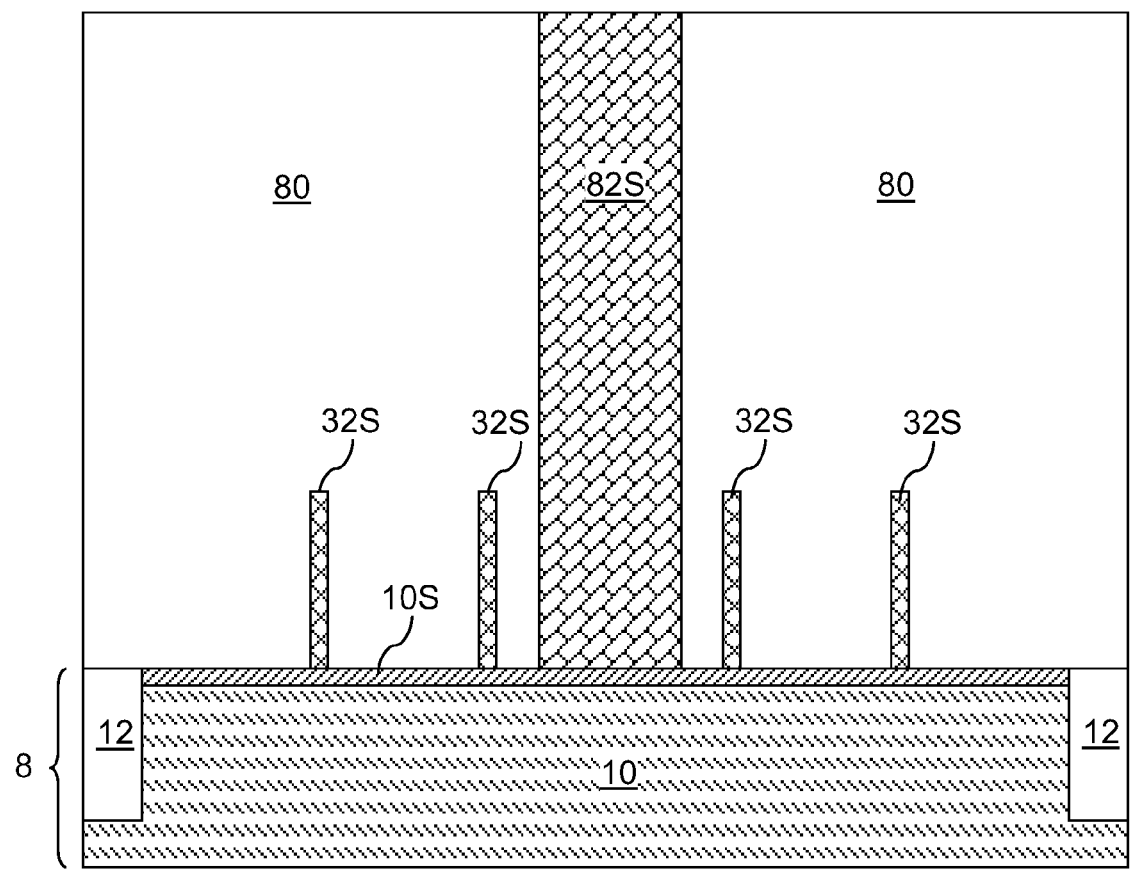
FIG. 10B is a vertical cross-sectional view of the first exemplary semiconductor structure along a vertical plane B-B' of FIG. 10A.

Referring to FIGS. 10A and 10B, a contact-level dielectric material layer 80 can be formed over the gate electrode 50 and the plurality of epitaxial semiconductor fins (32S, 32D, 32B). Various contact via structures can be formed through the contact-level dielectric material layer 80 to provide electrical contact to various components of the field effect transistor. The various contact via structures can include, for example, a source contact via structure 82S that contacts at least one of the planar source region 10S and the fin source regions 32S, a drain contact via structure 82D that contacts at least one of the planar drain region 10D and the fin drain regions 32D, and a gate contact via structure 85 that contacts the gate electrode 52.

Figure 11A:
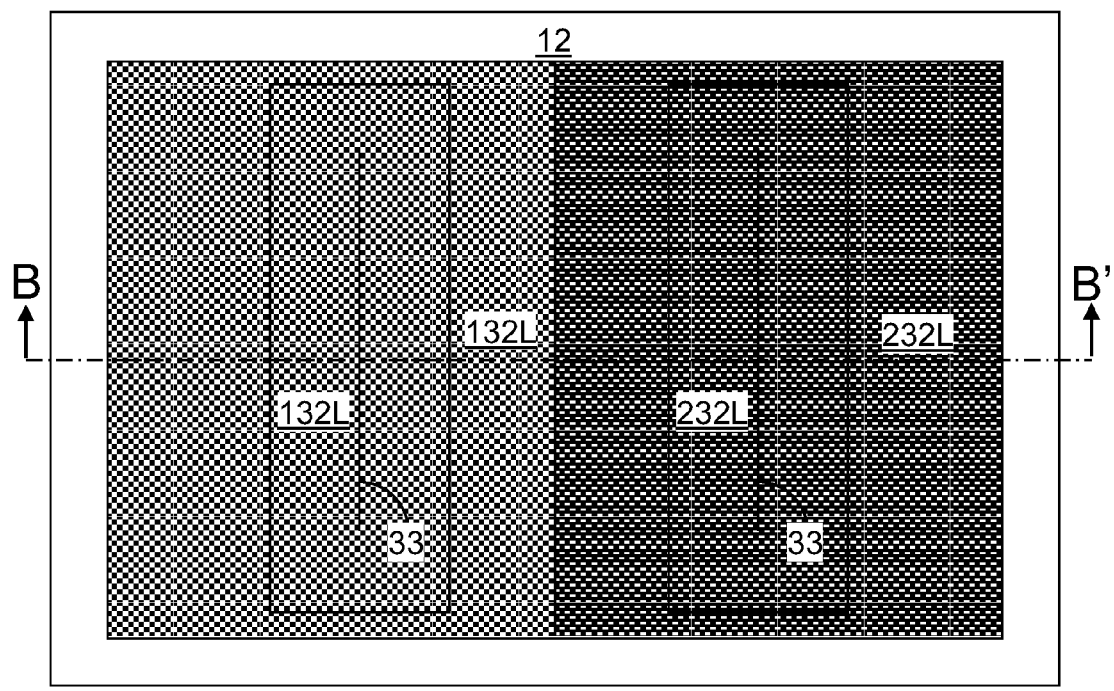
FIG. 11A is a top-down view of a second exemplary semiconductor structure after implantation of semiconductor ions into various portions of the amorphous semiconductor material layer according to a second embodiment of the present disclosure.
Figure 11B:
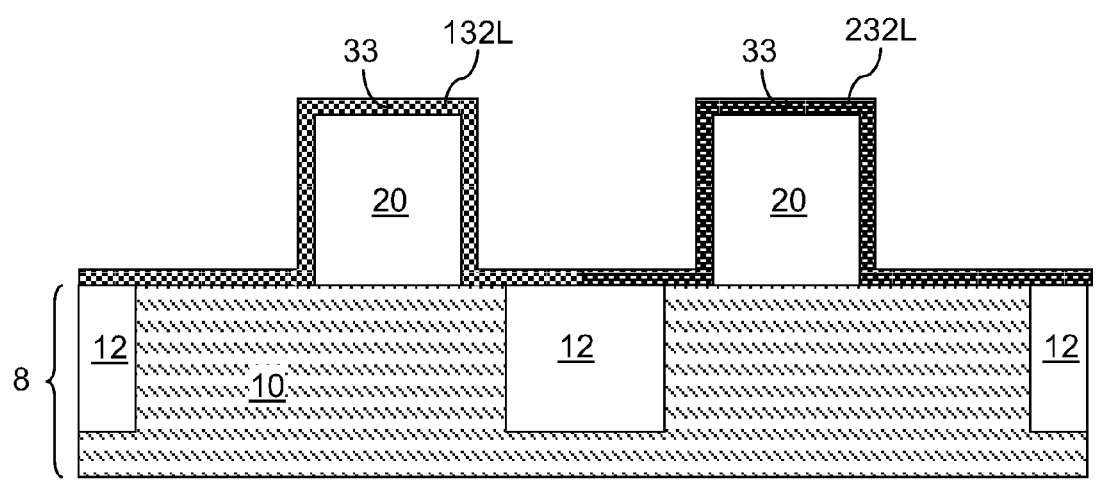
FIG. 11B is a vertical cross-sectional view of the second exemplary semiconductor structure along a vertical plane B-B' of FIG. 11A.

Referring to FIGS. 11A and 11B, a second exemplary semiconductor structure according to a second embodiment of the present disclosure can be derived from the first exemplary semiconductor structure of FIGS. 4A and 4B by implanting semiconductor ions into various portions of the epitaxial semiconductor material layer 32L. The implantation of the semiconductor ions can be performed by ion implantation or by plasma doping.

In one embodiment, multiple portions of the epitaxial semiconductor material layer 32L can be implanted with different semiconductor ions. For example, a first portion of the epitaxial semiconductor material layer 32L can be implanted with a first semiconductor ion (e.g., Ge) that is different from the second semiconductor material (e.g., Si) of the epitaxial semiconductor material layer 32L to form a first epitaxial semiconductor-composition-modulated layer 132L, and a second portion of the epitaxial semiconductor material layer 32L can be implanted with a second semiconductor ion (e.g., C) that is different from the second semiconductor material (e.g., Si) of the epitaxial semiconductor material layer 32L to form a second epitaxial semiconductor-composition-modulated layer 232L. Masked ion implantation or masked plasma doping can be employed, during which a portion of the epitaxial semiconductor material layer 32L is physically exposed while another portion of the epitaxial semiconductor material layer 32L is masked by a temporary masking material.

Figure 3B:
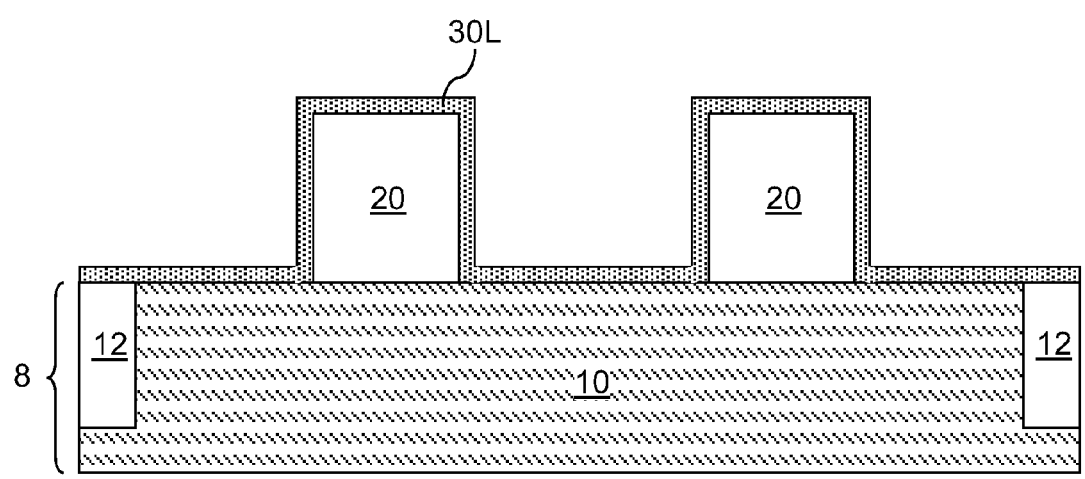
FIG. 3B is a vertical cross-section view of the first exemplary semiconductor structure along a vertical plane B-B' of FIG. 3A.

Alternately, the various semiconductor ions can be implanted into various portions of the amorphous semiconductor material layer 30L after the processing steps of FIGS. 3A and 3B and prior to the processing steps of FIGS. 4A and 4B to provide the second exemplary semiconductor structure shown in FIGS. 11A and 11B. In this case, the amorphous semiconductor material layer 30L includes the second semiconductor material, and at least another semiconductor material that is different from the second semiconductor material can be implanted into the amorphous semiconductor material layer 30L. Each implanted portion of the amorphous semiconductor material layer 30L can become a first epitaxial semiconductor-composition-modulated layer 132L or a second epitaxial semiconductor-composition-modulated layer 232L after solid phase epitaxy.

Figure 12A:
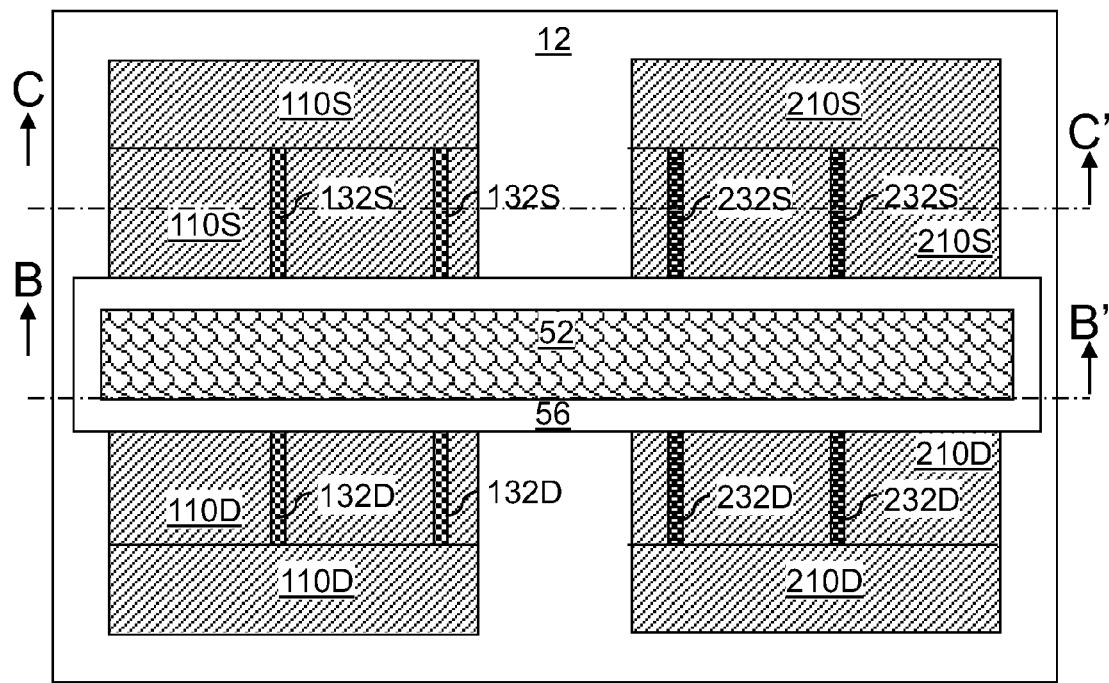
FIG. 12A is a top-down view of the second exemplary semiconductor structure after formation of a gate dielectric, a gate electrode, a gate spacer, source regions, and drain regions according to the first embodiment of the present disclosure.
Figure 12B:
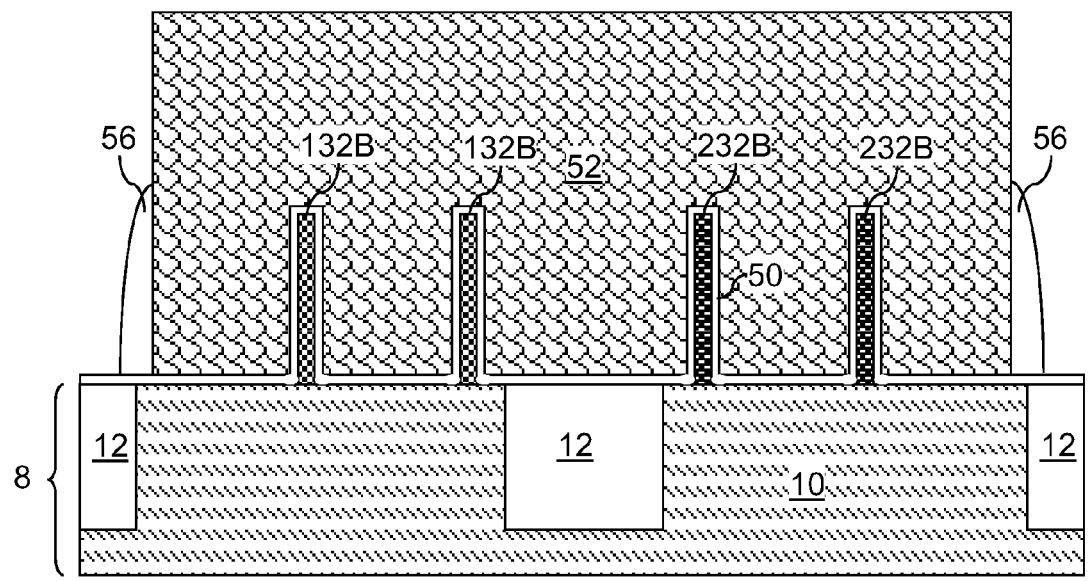
FIG. 12B is a vertical cross-sectional view of the second exemplary semiconductor structure along a vertical plane B-B' of FIG. 12A.

Referring to FIGS. 12A and 12B, the processing steps of FIGS. 5A, 5B, 6A-6C, 7A, 7B, 8A, 8B, and 9A-9C can be subsequently performed to provide the second exemplary semiconductor structure as illustrated in FIGS. 12A and 12B. Each field effect transistor includes a portion of a single crystalline semiconductor material layer 10 located in a substrate 8, a plurality of epitaxial semiconductor fins [(132S, 132D, 132B) or (232S, 232D, 232B)] in epitaxial alignment with a crystalline structure of the portion of the single crystalline semiconductor material layer 10 and having a uniform lateral thickness throughout, a stack of a gate dielectric 50 and a gate electrode 52 straddling over a center portion of each of the plurality of epitaxial semiconductor fins, a plurality of fin source regions (132S or 232S) located within a first end portion of each of the plurality of epitaxial semiconductor fins, a plurality of fin drain regions (232S or 232D) located within a second end portion of each of the plurality of epitaxial semiconductor fins. Each epitaxial semiconductor fin includes a fin body region (132B or 232B) that underlies a gate electrode 52.

Each field effect transistor can further include a planar source region (110S or 210S) located in a first surface portion of the single crystalline semiconductor material layer 10 and in contact with each of the plurality of fin source regions (132S or 232S), and a planar drain region (110D or 210D) located in a second surface region of the single crystalline semiconductor material layer 10 and in contact with each of the plurality of fin drain regions (132D or 232D).

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a semiconductor structure comprising:
    forming a dielectric mandrel structure having vertical sidewalls on a single crystalline semiconductor material layer;
    forming an amorphous semiconductor material layer on said vertical sidewalls and a top surface of said single crystalline semiconductor material layer;
    converting said amorphous semiconductor material layer into an epitaxial semiconductor material layer employing a crystalline structure of said single crystalline semiconductor material layer as a template; and forming an epitaxial semiconductor fin from said epitaxial semiconductor material layer by removing all horizontal portions of said epitaxial semiconductor material layer from an entire said top surface of said single crystalline semiconductor material layer and a top surface of said dielectric mandrel structure.

2. The method of claim 1, further comprising removing said dielectric mandrel structure selective to said epitaxial semiconductor fin and said single crystalline semiconductor material layer.

3. The method of claim 1, wherein said conversion of said amorphous semiconductor material layer into said epitaxial semiconductor material layer is performed by solid phase epitaxy in which crystalline portions of said epitaxial semiconductor material layer nucleate at an interface between said single crystalline semiconductor material layer and said amorphous semiconductor material layer.

4. The method of claim 3, wherein said crystalline portions of said epitaxial semiconductor material layer grow upward by incorporating a semiconductor material of said amorphous semiconductor material layer.

5. The method of claim 1, wherein said dielectric mandrel structure is formed by:
   depositing a dielectric material layer on a top surface of said single crystalline semiconductor material layer; and
   patterning said dielectric material layer, wherein a patterned portion of said dielectric material layer is said dielectric mandrel structure.

6. The method of claim 5, wherein said patterning of said dielectric material layer comprises:
   applying a photoresist layer over said dielectric material layer;
   lithographically patterning said photoresist layer; and
   transferring a pattern in said photoresist layer into said dielectric material layer by an anisotropic etch.

7. The method of claim 1, wherein said epitaxial semiconductor fin is formed as a contiguous structure laterally surrounding said dielectric mandrel structure.

8. The method of claim 7, further comprising removing end portions of said epitaxial semiconductor fin, wherein remaining portions of said epitaxial semiconductor fin constitute a pair of parallel rectangular epitaxial semiconductor fins, each having a rectangular horizontal cross-sectional area.

9. The method of claim 1, wherein said single crystalline semiconductor material layer and said epitaxial semiconductor fin have a same lattice constant.

10. The method of claim 1, wherein said single crystalline semiconductor material layer comprises a first semiconductor material having a first lattice constant, and said epitaxial semiconductor fin comprises a second semiconductor material having a second lattice constant that is different from said first lattice constant by a percentage greater than 0 and less than 3% in an unstrained state.

11. The method of claim 1, wherein said amorphous semiconductor material layer comprises a semiconductor material, and said method further comprises implanting another semiconductor material that is different from said semiconductor material into said amorphous semiconductor material layer.

12. The method of claim 1, further comprising:
   forming a stack of a gate dielectric and a gate electrode on a center portion of said epitaxial semiconductor fin;
   forming a fin source region in a first end portion of said epitaxial semiconductor fin located at one side of said center portion; and
   forming a fin drain region in a second end portion of said epitaxial semiconductor fin located at another side of said center portion.

13. The method of claim 12, further comprising:
   forming a planar source region contacting said fin source region within a first surface region of said single crystalline semiconductor material layer; and
   forming a planar drain region contacting said fin drain region within a second surface region of said single crystalline semiconductor material layer.

14. The method of claim 1, further comprising forming a shallow trench isolation structure embedded within said single crystalline semiconductor material layer.

15. The method of claim 14, wherein said shallow trench isolation structure is formed as a contiguous structure laterally surrounding an upper portion of said single crystalline semiconductor material layer.

16. The method of claim 1, wherein at least one vertical sidewall of said epitaxial semiconductor fin is in direct physical contact with a remaining portion of said epitaxial semiconductor material layer.

* * * * *